United States Patent [19]

Isenberg

[11] 4,374,163
[45] Feb. 15, 1983

[54] METHOD OF VAPOR DEPOSITION

[75] Inventor: Arnold O. Isenberg, Forest Hills Boro., Pa.

[73] Assignee: Westinghouse Electric Corp., Pittsburgh, Pa.

[21] Appl. No.: 307,139

[22] Filed: Sep. 29, 1981

[51] Int. Cl.³ .............................................. C23C 11/00
[52] U.S. Cl. ..................................... 427/253; 427/74; 427/86; 427/248.1; 427/255.2
[58] Field of Search ............... 427/74, 86, 248.1, 253, 427/255.2; 423/350; 156/611; 264/81

[56] References Cited

U.S. PATENT DOCUMENTS 3,139,361 6/1964 Rasmanis ............................ 148/175
3,969,163 7/1976 Wakefield ............................ 427/86
4,102,767 7/1978 Mazelsky ............................ 423/350
4,225,367 9/1980 Anglerot ........................... 427/255.1

OTHER PUBLICATIONS

Chu et al., "High-Efficiency Thin-Film Polycrystalline-Silicon Solar Cells", J. Appl. Phys. 50 (2), Feb. 1979, pp. 919–921.

Primary Examiner—John D. Smith
Attorney, Agent, or Firm—R. D. Fuerle

[57] ABSTRACT

Disclosed is a method of forming a deposit, such as silicon, by the reaction of a reactant, such as lithium, with a gas containing the element or compound to be deposited, such as silicon tetrachloride. One reactant diffuses through the growing scale on a heated inert substrate to react with the gas on the other side of the scale and lead to further scale growth.

12 Claims, 2 Drawing Figures

METHOD OF VAPOR DEPOSITION

BACKGROUND OF THE INVENTION

Silicon for use in solar cells can be prepared by a chemical vapor deposition (CVD) process, such as the decomposing silane or the direct reaction of silicon tetrachloride with hydrogen or metal vapors at elevated temperatures (CVD). Silicon produced by these processes, however, is polycrystalline with a random grain orientation so that many of the grain boundaries are perpendicular to the incident light on the solar cell, which results in the entrapment of charge carriers at grain boundaries. In addition, chemical vapor deposition produces a deposit of non-uniform thickness because the silicon deposition rate varies with the local temperature and the reactant concentrations. A further difficulty with chemical vapor deposition is that the silicon is deposited not only on the substrate, but also on the reactor walls which wastes material and leads to high processing cost.

Some of these difficulties have been overcome by depositing the silicon on molten metals, one of which contains dissolved zinc (see U.S. Pat. No. 4,225,367) which reacts with the silicon tetrachloride gas above the molten metal to produce zinc chloride, which is vaporized, and silicon, which is deposited on the molten metal. This process prevents the deposition of the silicon on the walls of the reactor, provides a more uniform thickness of silicon, and results in columnar growth of the silicon so that grain boundaries are perpendicular to the surface and to the incident light.

While this process is an improvement over the chemical vapor deposition process, it is limited to the production of flat sheets of silicon. Also, it presents a control problem in that the zinc in the molten metal becomes depleted and must be replaced, which makes it difficult to maintain a uniform zinc concentration.

SUMMARY OF THE INVENTION

I have discovered a process of chemical vapor deposition which retains all of the advantages of the molten metal process but which avoids some of its difficulties. In the process of this invention the silicon is deposited on an inert substrate. A vapor containing the element or compound to be deposited is kept on one side of the substrate and the reactant diffuses through the substrate from its other side reacting with the vaor to form the deposit on its substrate. In this process, the solid reaction product separates the two reacting species and reaction can proceed only by the solid state diffusion of at least one of the reactants through the solid reaction product. The scale of the reaction product can then grow in thickness when conditions are favorable, such as an elevated temperature (to foster diffusion), continuous supply of reactants, and removal of reaction by-products. By this method I am able to form coatings on substrates of any permeable form or, by subsequently removing the deposit, I can form deposits of any shape. In addition, since I use only gaseous reactants, I avoid the control problems caused by depletion of a liquid reactant.

DESCRIPTION OF THE INVENTION

Figure 1:
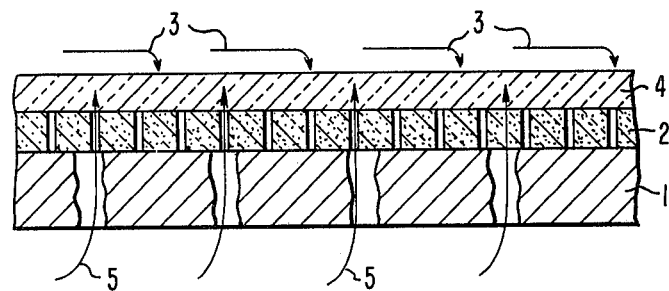
FIG. 1 is a side view in section of a substrate being coated according to a certain presently preferred embodiment of the process of this invention.

In FIG. 1 an inert permeable substrate 1 having a layer of powdered release agent 2 thereon has a vaporized compound 3 containing the element or compound being deposited as deposit 4 on one side, and a vaporized reactant 5 on the other side. The reactant 5 diffuses through inert permeable substrate 1 and through release agent 2 to react with compound 3 forming deposit 4.

Figure 2:
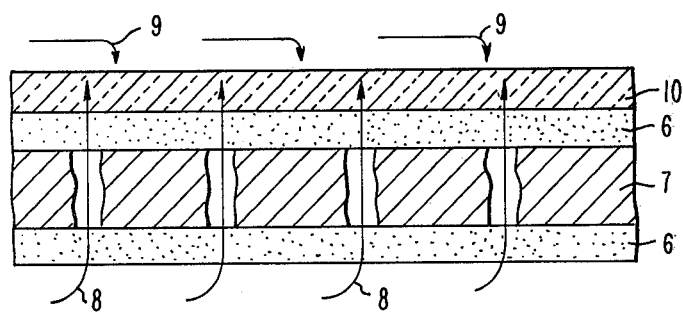
FIG. 2 is a side view in section of a substrate being coated according to an alternative presently preferred embodiment of the process of this invention.

In FIG. 2 a melt 6 of a salt, preferably of an alkali or alkaline earth metal, fills the pores of inert permeable substrate 7 and provides a thin film on its surface. The molten salt aids in controlling nucleation and produces a smoother surface on the deposit. The reactant 8 dissolves in and diffuses through the liquid 6 as if in a gaseous state. It also diffuses through the porous substrate to react with compound 9, containing the element or compound to be deposited, and forms deposit 10.

The compounds and elements which can be deposited using the process of this invention include the elements of the third, fourth, and fifth group of the periodic table. Silicon, zirconium, niobium, tin, and born are preferred. Silicon is especially preferred as it is very useful in making solar cells.

The compound from which the deposit is formed has the general formula $MX_n$ where M is the deposited element or one of the deposited elements and X is chloride, bromide, or iodide. If the deposit is a compound instead of an element, then M is an appropriate mixture of the elements in the compound.

The reactants may be hydrogen or elements of the first and second group of the periodic table up to atomic number 30. Lithium is a preferred reactant as it diffuses rapidly through the substrate due to its small atomic radius. It may be desirable to use ammonia as a source of hydrogen as decomposition of the ammonia can form atomic hydrogen which diffuses more rapidly than molecular hydrogen. The reactant, R, and the compound react to form the deposit, M, as follows:

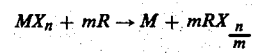

$$MX_n + mR \rightarrow M + mRX_{\frac{n}{m}}$$

where n is the valence of M and m is n/valence of R.

The substrate is an inert material that will not diffuse into the deposit or react with it during the process. Suitable substrates include graphite silicon and silicon carbide. Graphite is preferred as it is inexpensive and non-reactive with chloride and metal vapors under selected conditions. The substrate need not necessarily be porous as some reactants, such as lithium, can diffuse through theoretically dense graphite, but a porous substrate permits faster diffusion and the use of a wider range of reactants. A practical range of porosity is a pore size of about 1 to 50 microns. In order to avoid forming a very rough surface on the deposit the pore size should not exceed the thickness of the deposit. While a small pore size makes for smoother deposits it inhibits diffusion due to tortuosity. Unnecessary diffusion barriers can be avoided by making the substrate no thicker than is required for mechanical strength. The substrate may be of any length or width.

It is preferable to coat the substrate with a thin layer of a powdered release agent if the deposit is to be removed from the substrate. Graphite, for example, makes a suitable release agent. A preferred release agent, however, is a powder of the element or compound which is to form the deposit as it seeds the growth of the deposit. Also, it enables one to control the grain size of the deposit by the number of seeds per unit area as a large number of seeds per unit area will result in small grain size while few seeds per unit area will result in large grain size. The thickness of the layer of release agent is preferably about 1 to about 100 microns.

In the process of this invention the substrate is heated to increase the diffusivity of the reactant through the solid and dense reaction product M and to vaporize the reaction by-products. Heating can be accomplished by radio frequency or radiation or other suitable method. The temperature to which the substrate is heated depends upon the particular reactants to be used. The temperature should be high enough to vaporize the by-products and to cause the reaction to proceed, but too high a temperature may result in interactions between the substrate and the deposit and will waste energy. It is also necessary to heat the reactants sufficiently to vaporize them in quantities adequate for a practical reaction. For some reactants such as silicon tetrachloride, room temperature may be adequate for this purpose.

It is preferable to bring gaseous reactants to the substrate by means of a non-reactive carrier gas, such as argon or nitrogen, to increase the flow of the reactants. A vacuum may be used to increase the grain size of the deposited material. While a small grain size results in a stronger deposit, a larger grain size is more desirable for solar cells.

The process of this invention can typically deposit about 100 microns per hour of the deposit. A greater deposition rate can be obtained by using higher temperatures, (to increase diffusivity) and higher flow of reactants. The deposition rate decreases, of course, as the thickness of the deposit increases. For solar cells a thickness of at least about 100 microns is desirable. Deposits may be made horizontally, vertically, or on curved surfaces. Deposited coating without release layers could serve as permanent coatings for support substrates to give them desirable physical and chemical properties. The following examples further illustrate this invention.

EXAMPLE

A rectangular plate of graphite, 2" by 2" by ⅛" was covered with a thin porous layer of carbon powder (lamp black) nearly 4 mils thick. The plate was placed on a flat graphite container of similar dimensions containing lithium metal (∼2 g), so that the graphite plate acted as a lid for the rectangular container for lithium, with the carbon layer facing upward. This assembly was placed in a quartz reactor tube and was heated by an electrical furnace to 800° C. while being evacuated to nearly 10 mm Hg, with argon as the flowing purge-gas. Then, silicon tetrachloride was introduced by bubbling argon through the liquid SiCl₄ at room temperature and introducing the mixed gases into the reactor. The reaction product, lithium chloride, was noticed in the colder reactor part as a white condensate, and silicon grew as a scale on the graphite plate by the lithium diffusion process described above. Here, lithium diffused through the solid reaction product in a concentration gradient of lithium. The lithium emerged at the silicon surface and reacted with silicon tetrachloride to form more dense silicon and lithium chloride which can be removed by vaporization. No silicon was deposited on any other reactor component but on the substrate, which allowed the lithium to diffuse to the deposit or reaction product. The overall reaction was:

$$SiCl_4 + 4Li \rightarrow Si + 4LiCl$$

In principle, other scales can be grown by this method; however, the growing scale must accommodate the solid state diffusion of lithium or other reactant through the scale bulk material so that scale growth can proceed.

I claim:

1. A method of forming a dense layer of a polycrystalline metal M according to the reaction $$MX_n + mR \rightarrow M + mRX_{\frac{n}{m}}$$

where M is selected from the group consisting of elements of periodic table groups III, IV, and V and mixtures thereof, each X is independently selected from the group consisting of chlorine, bromine, and iodine, R is selected from the group consisting of hydrogen, elements of periodic table groups I and II to atomic number 30, and mixtures thereof, n is the valence of M, and m is n/valence of R, comprising (A) heating an inert substrate which separates said mR from said $MX_n$ and which is permeable by said mR, to a temperature high enough to vaporize said $$mRX_{\frac{n}{m}},$$

(B) heating said mR on one side of said substrate sufficiently to diffuse it through said substrate; and
(C) heating said $MX_n$ on the other side of said substrate sufficiently to vaporize it.

2. A method according to claim 1 wherein M is selected from the group consisting of silicon, zirconium, titanium, niobium, tin, and boron.

3. A method according to claim 2 wherein M is Si.

4. A method according to claim 1 wherein X is Cl.

5. A method according to claim 1 wherein R is Li.

6. A method according to claim 5 wherein M is Si, X is Cl, n is 4, and m is 4.

7. A method according to claim 1 wherein said substrate is covered with a layer of powdered M.

8. A method according to claim 1 wherein said substrate is graphite.

9. A method according to claim 8 wherein said graphite has a pore size of about 1 to about 50 μm.

10. A method according to claim 1 wherein vapors of said $MX_n$ and vapors of said mR are transported to said substrate with an inert carrier gas.

11. A method according to claim 10 wherein said carrier gas is selected from the group consisting of argon and nitrogen.

12. A method of forming a dense layer of silicon on a graphite substrate comprising (A) placing said substrate over an aperture of an enclosure containing lithium metal;
(B) heating said substrate to a temperature sufficient to vaporize LiCl₄;
(C) heating said lithium to a temperature sufficient to diffuse it through said substrate; and
(D) heating SiCl₄ on the opposite side of said substrate sufficiently to vaporize it.

* * * * *